United States Patent
Tung (10) Patent No.: US 6,578,754 B1
(45) Date of Patent: Jun. 17, 2003

(54) PILLAR CONNECTIONS FOR SEMICONDUCTOR CHIPS AND METHOD OF MANUFACTURE

(75) Inventor: Francisca Tung, Austin, TX (US)

(73) Assignee: Advanpack Solutions Pte. Ltd., Singapore (SG)

( * ) Notice: Subject to any disclaimer, the term of this patent is extended or adjusted under 35 U.S.C. 154(b) by 0 days.

(21) Appl. No.: 09/564,382

(22) Filed: Apr. 27, 2000

(51) Int. Cl.[7] ............................................. B23K 35/14
(52) U.S. Cl. ................................ 228/180.22; 228/123.1
(58) Field of Search ........................... 228/180.22, 254, 228/123.1, 193–195, 56.3; 428/403, 209, 643, 644, 570; 148/24; 106/286.2, 287.19; 438/613–617; 257/737–738

(56) References Cited

U.S. PATENT DOCUMENTS

| | | | |
|---|---|---|---|
| 4,705,205 A | * 11/1987 | Allen et al. | |
| 5,075,965 A | * 12/1991 | Carey et al. | |
| 5,130,779 A | 7/1992 | Agarwala et al. | 357/67 |
| 5,334,804 A | 8/1994 | Love et al. | 174/267 |
| 5,536,362 A | 7/1996 | Love et al. | 156/643.1 |
| 5,773,889 A | 6/1998 | Love et al. | 257/737 |
| 5,773,897 A | 6/1998 | Wen et al. | 257/778 |
| 5,790,377 A | 8/1998 | Schreiber et al. | |
| 5,807,766 A | 9/1998 | McBride | 438/119 |
| 6,015,505 A | * 1/2000 | David et al. | |
| 6,105,851 A | * 8/2000 | Norell et al. | |
| 6,196,443 B1 | * 3/2001 | DiGiacomo | |
| 6,369,451 B2 | * 4/2002 | Lin | |

FOREIGN PATENT DOCUMENTS

| | | |
|---|---|---|
| EP | 0602328 A2 | 9/1993 |
| EP | 0889512 A2 | 4/1998 |
| JP | 04037139 | 5/1992 |

OTHER PUBLICATIONS

"A fine pitch and high aspect ratio bump fabrication process for flip–chip interconnection," by Yamada et al., Electronic Manuf. Tech. Symp., 1995, Proceedings of 1995 Japan Int'l 18th, IEEE/CPMT Int'l Omiya, Japan, Dec. 4–6, 1995, New York, NY, USA, IEEE, pp. 121–124 XP010195564.

"Wire Interconnect Technology, a New High–Reliability Tight–Pitch Interconnect Technology," D. Love et al., Fijitsu Computer Packaging Technologies, Inc., ITAP (International TAB, Flip Chip and BGA Packaging Conference) Feb. 1996,, 7 pages.

* cited by examiner

*Primary Examiner*—Tom Dunn
*Assistant Examiner*—Jonathan Johnson
(74) *Attorney, Agent, or Firm*—George O. Saile; Stephen B. Ackerman (57) ABSTRACT

A flip chip interconnect system comprises and elongated pillar comprising two elongated portions, one portion including copper and another portion including solder. The portion including copper is in contact with the semiconductor chip and has a length preferably of more than 55 microns to reduce the effect of α particles from the solder from affecting electronic devices on the chip. The total length of the pillar is preferably in the range of 80 to 120 microns.

9 Claims, 6 Drawing Sheets

PILLAR CONNECTIONS FOR SEMICONDUCTOR CHIPS AND METHOD OF MANUFACTURE

BACKGROUND OF THE INVENTION

This invention relates in general to interconnections for semiconductor devices and, in particular, to pillar-shaped connections from a semiconductor chip to a substrate and method for making the connections.

Tin lead based solders is the preferred interconnect material of choice for flip chip bonding of silicon integrated circuits. As dimensions of the electronic devices on the silicon integrated circuits are continually reduced, α particle emissions by lead can cause significant problems. Lead has three stable isotopes which are formed as the end products of natural radioactive decay chains. These stable isotopes, however, usually contain a small amount of residual α particle radioactivity. As the dimensions of electronic devices in silicon integrated circuits become smaller, the distances between the lead-based solder and the devices are also reduced so that the α particle emission from the solder can cause such devices to malfunction.

One way to reduce the effect of α particle emission from solder is to provide a passivation layer covering the electronic devices on silicon. Some materials used for the passivation layer are more effective than others for preserving the integrity of the electronic devices from the α particles. Furthermore, the residual a particle emission from the solder radiate from essentially point sources in the solder, so that the intensity of α particle emission experienced by the electronic devices decreases rapidly with the distances separating the devices from the solder. Shown below is a table setting forth five different materials serving as the medium separating electronic devices from the solder.

| MEDIA (Compound) | Density $\rho$ (g.cm$^{-3}$) | Mol. Wt. M(g) | -dE/dx (eV.cm$^2$/1e15 atoms) | Effective Thickness d(cm) |
|---|---|---|---|---|
| Air | 1.161e-03 | 39.11 | 20.96 | 10.83 |
| Polyimide | 1.61 | 38.0 | 18.91 | 0.0084 |
| Epoxy | 1.20 | 40.0 | 19.68 | 0.0114 |
| SiO$_2$ | 2.65 | 60.0 | 27.42 | 0.0055 |
| Si$_3$N$_4$ | 3.17 | 140.0 | 28.18 | 0.0105 |

As can be seen from the table above, if air is the only medium that separates the electronic devices from the solder, then in order for the electronic devices not be significantly affected by the α particle emission from the solder, the effective thickness of the air medium separating the electronic devices and the solder should be at least 10.83 cm, which is unacceptable for most applications. From the above table, it will be noted that the best barrier layer substance in terms of minimum absorption length for absorption of α particles from the solder is silicon dioxide, followed by polyimide. Where silicon dioxide or another solid material is used as the passivation layer, only part of the medium separating the electronic devices from the solder is occupied by the material, with the remaining part occupied by air or another material not as effective in absorbing α particles. It will be noted from the table, however, that even where silicon dioxide is used as a compound for the passivation layer covering the electronic devices on silicon, it is preferable that the electronic devices and the solder be separated by at least 0.0055 cm or 55 microns. For polyimide passivation layers, the separation is preferably at least 84 microns.

In conventional interconnect systems, lead-based solders are used for connecting flip chips to substrates. Aside from the α particle emission problem described above, as the structural dimensions of electronic devices get smaller, the use of lead-based solder bumps is disadvantageous also because it may be difficult to achieve a fine pitch between adjacent interconnects without bridging which causes electrical shorting. When the solder bump is formed by electroplating, the bump size in the horizontal plane of a 100 micron high solder ball will be around 120 microns, and the solder bump is in the shape of a mushroom. Therefore, if the pitch or distance between adjacent interconnects using solder bumps of such height is reduced to below 150 microns in either the array or peripheral format, bump ridging can easily occur. It is, therefore, desirable to provide an improved interconnect system to achieve finer pitch with minimum probability of bump bridging and where α particle emission will not significantly affect the functions of electronic devices on the semiconductor chips.

In the document entitled "Wire Interconnect Technology, A New High-Reliability Tight-Pitch Interconnect Technology," by Love et al., from Fujitsu Computer Packaging Technologies, Inc. an all copper interconnect post is proposed. Instead of using lead based solder, the flip chip is connected to a substrate by means of an all copper post which is about 45 or 50 microns in length. While such copper-based interconnects may be able to achieve a finer pitch between adjacent interconnects, such proposed solution still does not avoid the problem of the α particle emission described above. As shown in FIG. 1 of the article by Love et al., solder is used to attach the copper posts to the substrate. Since the height of the copper post or pillars is not more than 50 microns in height, even where silicon dioxide is used as the passivation layer covering the electronic devices on the flip chips, the electronic devices may still be adversely affected by α particle emission by the solder used to attach the copper posts to the substrate. Furthermore, as known to those skilled in the art, the space between the semiconductor flip chip and the substrate is usually filled with an underfill material to provide support and stability to the interconnect structure. Typically, the process of providing the underfill material is by injection that requires a certain minimum separation between the semiconductor chip and the substrate. For most injection processes, the minimum separation is about 75 microns. Therefore, using the interconnect structure proposed by Love et al. in the article, there appears to be inadequate separation between the semiconductor chip and the substrate for injecting the underfill material. The process employed by Love et. al appears to limit the height of the copper post achievable to not more than 50 microns.

None of the above-described interconnect systems is entirely satisfactory. It is, therefore, desirable to provide an improved interconnect system in which the above-described difficulties are not present.

SUMMARY OF THE INVENTION

This invention is based on the observation that an elongated pillar may be advantageously used for connecting a semiconductor chip to a substrate, where the pillar comprises two elongated portions, one portion including copper and another portion including solder. The portion including copper is in contact with the semiconductor chip and has a length not less than about 50 microns. Preferably, the total length of the pillar is not less than about 55 microns. In a more preferred embodiment, the length of the pillar is not less than about 85 microns, with the length of the portion of the pillar including copper not less than about 55 microns.

Using the elongated pillar of this invention, the separation between the solder in the pillar or any other solder used in the interconnect on the one hand and electronic devices on the semiconductor chip on the other hand can be made to exceed 55 microns or even 84 microns so that the electronic devices on the semiconductor chip will not be adversely effected by α particle emission from the solder when silicon dioxide or polyimide is used as the passivation layer. Where the length of the pillar exceeds 75 microns, adequate separation is provided between the semiconductor chip and the substrate for the injection of the underfill material. Furthermore, by providing elongated pillars of adequate length and suitable cross-sectional dimensions connecting the semiconductor chip to the substrate, the stress induced in the connection between the semiconductor chip and the pillar due to warpage is much reduced, which also reduces the chances of chip failure caused by shear stress on account of the warpage.

The elongated pillar may be formed by first forming a layer of photosensitive material on the chip and exposing to radiation the layer at the predetermined areas. Portions of the layer that are exposed to radiation are removed to form through holes in the layer. Portions of the holes are filled with a material containing copper to form an elongated column of copper material in contact with the chip. Portions of the holes are then filled with a material containing solder to form an elongated column of solder in contact with the copper material, thereby forming a composite pillar, a portion of which includes copper and another portion of which including solder. The photosensitive layer is then removed to form the elongated pillars. After the pillars have been formed, the pillars may be connected to the substrate by placing the pillars in contact with the substrate and heating the solder until the solder reflows. Preferably, the filling of the holes of the photosensitive material layer with copper material or solder is done by electroplating.

BRIEF DESCRIPTION OF THE DRAWINGS

For simplicity in description, identical components are identified by the same numerals.

DETAILED DESCRIPTION OF THE PREFERRED EMBODIMENTS

Figure 1A:
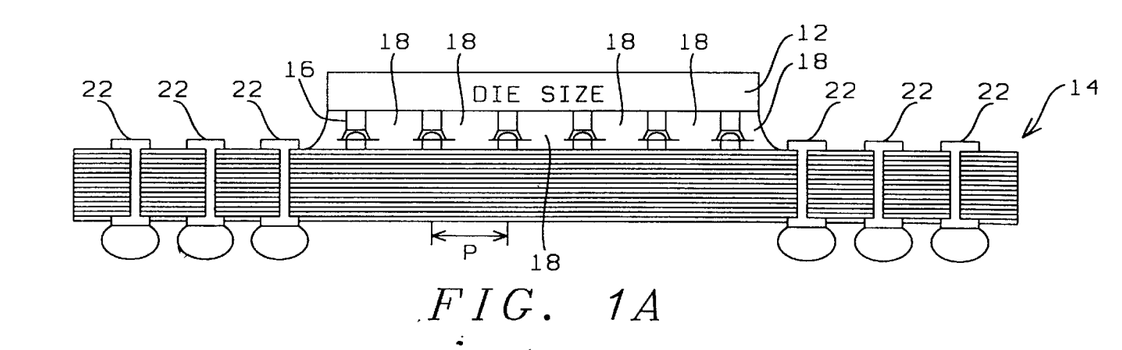
FIG. 1A is a cross-sectional view of a flip chip connected to a substrate using the elongated pillars of this invention to illustrate the invention.

FIG. 1A is a cross-sectional view of a semiconductor die in the form of a flip chip 12 connected to a substrate 14 by means of elongated pillars 16 to illustrate an embodiment of the invention. As shown in FIG. 1A, the space between the die 12 and substrate 14 is filled with an underfill material 18 such as one known to those of skill in the art to provide support and stability to the die and interconnect structure formed by the elongated pillars 16.

Figure 1B:
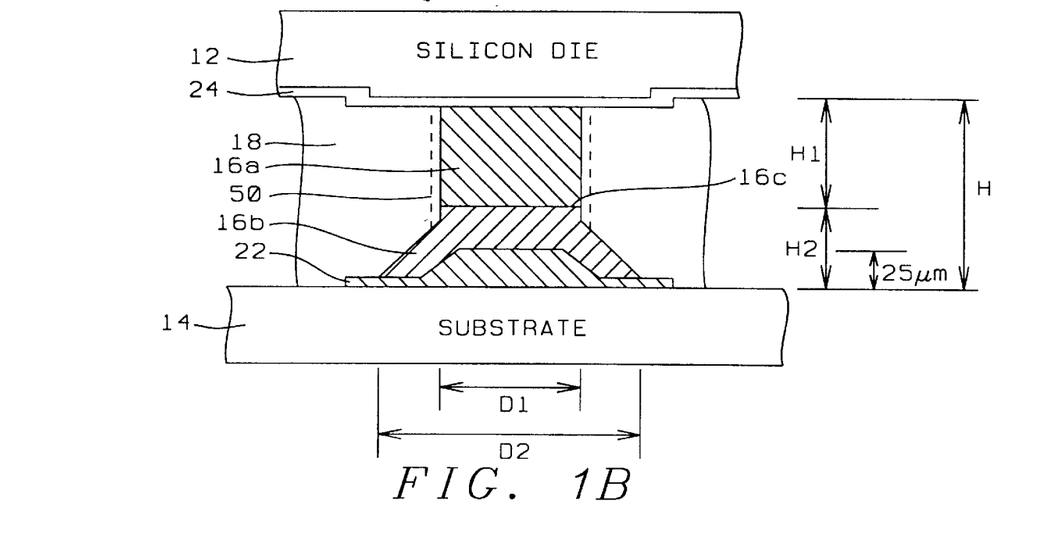
FIG. 1B is an exploded view of a portion 1B of the system of FIG. 1A showing in more detail the interconnection between the elongated pillar, the silicon die and the substrate.

FIG. 1B is an exploded view of a portion 1B of the system of FIG. 1A showing in more detail and elongated pillar connecting a portion of the silicon die to the substrate. As shown in FIG. 1B, pillar 16 comprises two parts: an upper elongated portion 16a comprising copper of height H1 and a second elongated portion of height H2 comprising a lead-based solder. The junction between the two portions 16a, 16b is at 16c. The bottom part of portion 16b is enlarged compared to its upper part and has a substantial conical shape where the bottom part of the solder portion of 16b is the result of a reflow process as described below to make physical and electrical contact with the copper contact layer 22 on top of substrate 14. The upper end of portion 16a is in attached to a copper contact 24 on the silicon die 12. In this manner, circuits on the silicon die 12 are electrically connected through pillar 16 to a copper contact 22 on the substrate 14. As shown in FIGS. 1A and 1B, the space between the semiconductor die 12 and substrate 14 is filled with an underfill material 18.

As shown in FIG. 1B, circuits (not shown) on the silicon die 12 are spaced apart from the solder portion 16b by the length or height of portion 16a containing copper. The surface of the silicon die 12 facing the substrate is coated with a passivation layer (not shown) made of a suitable material such as silicon dioxide or polyimide. Therefore, if the length or height H1 of portion 16a exceeds the effective thickness shown in the table above, then the circuits on die 12 will not be significantly adversely affected by the α particle emission from solder 16b. In the preferred embodiment, the height H1 of the portion 16a is not less than 55 microns, where silicon dioxide is used as the passivation layer, and more preferably, more than 84 microns where polyimide is used as the passivation layer. To permit many injection processes to be used for injecting the underfill material 18, the total height H of pillar 16 between die 12 and the substrate 14 is at least 75 microns, such as in the range of about 80–100 microns. For reasons discussed below, a larger value for H would reduce the shear stress experienced by the silicon die and the connection between the die 12 and pillar 16. Thus, it may be preferable for the total height H of the pillar to be at least 100 microns, and more preferably 120 microns or more, such as 125 microns. It may be preferable for the ratio H1 to H2 to be about 3 to 1.

FIGS. 2A–2G are cross-sectional views of a semiconductor die and the various layers associated therewith to illustrate the process for making the elongated pillar interconnect shown in FIGS. 1A, 1B and of process for connecting the pillar to a substrate to illustrate the invention.

Figure 2A:
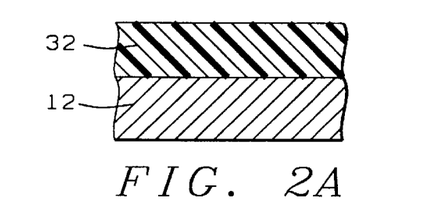
FIGS. 2A–2G are cross-sectional views of a portion of a semiconductor die and various layers associated with the die to illustrate a process for making the elongated pillars attached to the die and the attachment of such pillars to a substrate to illustrate an embodiment of the invention.
Figure 2B:
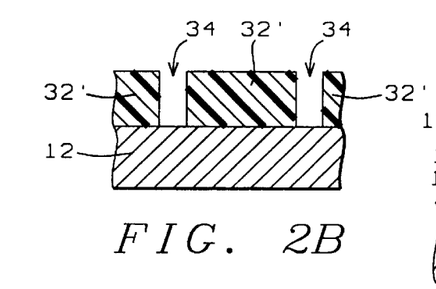
Figure 2C:
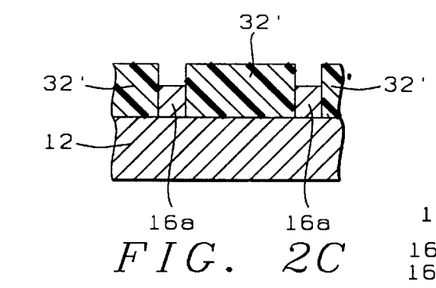
Figure 2D:
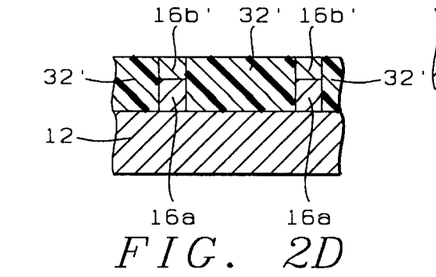
Figure 2E:
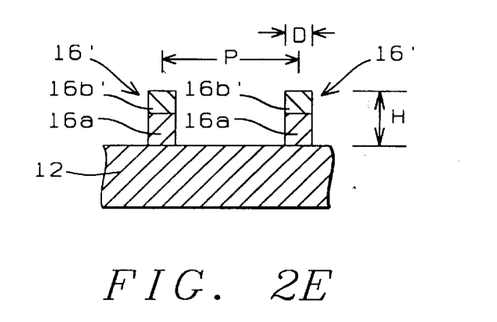
Figure 2F:
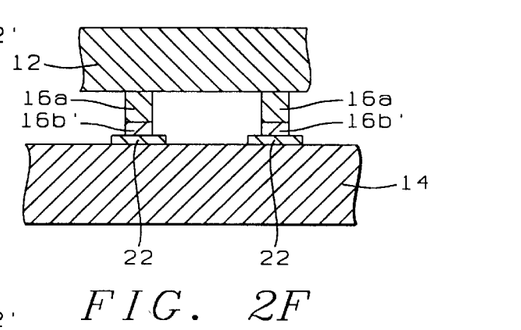
Figure 2G:
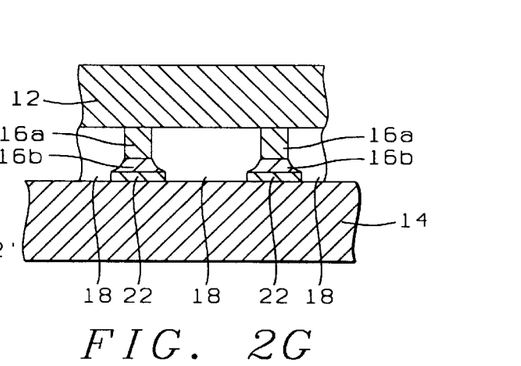
Figure 3A:
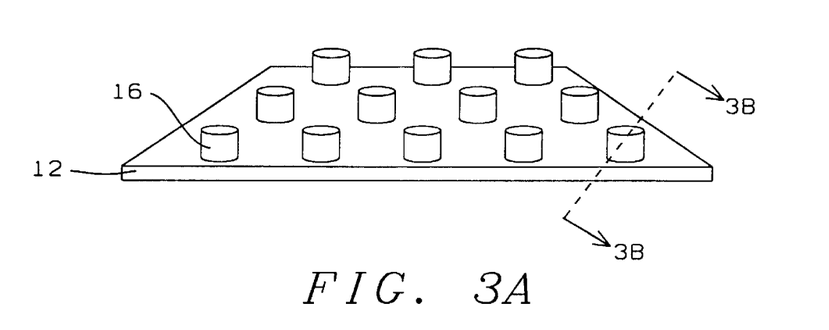
FIG. 3A is a perspective view of a flip chip with elongated pillars on one side of the chip to illustrate an embodiment of the invention.
Figure 3B:
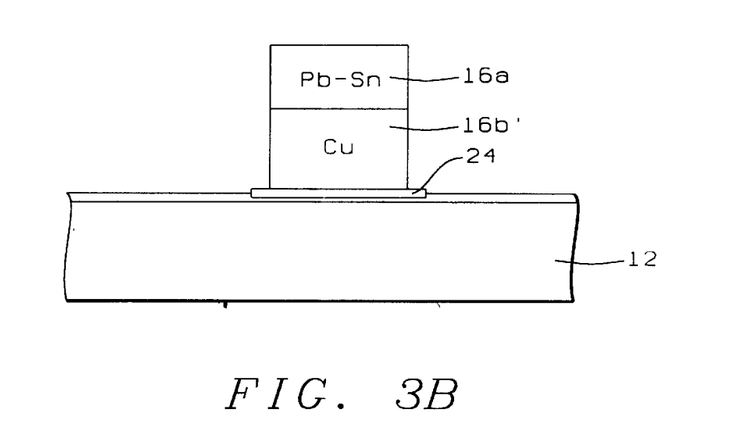
FIG. 3B is a cross-sectional view of a portion 3B of the chip of FIG. 3A to illustrate the embodiment of the invention.
Figure 3C:
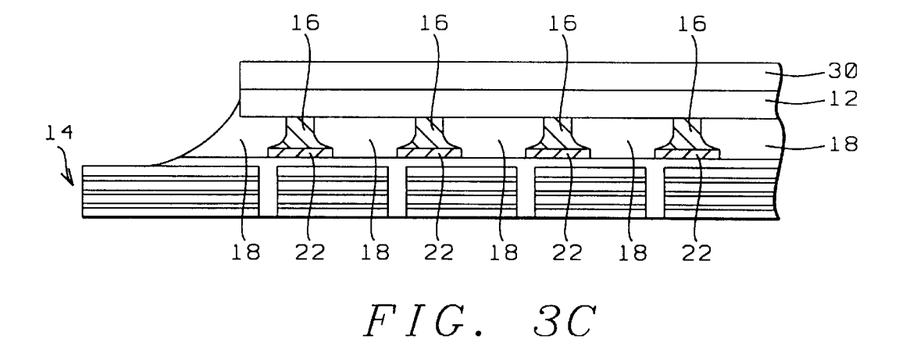
FIG. 3C is a cross-sectional view of a portion of the flip chip and the substrate after the flip chip has been attached to the substrate and the underfill material injected to illustrate an embodiment of the invention.

As shown in FIG. 2A, a photosensitive layer 32 is formed on the die 12. To simplify the drawing, only portions of the die and of the various layers are shown in FIGS. 2A–2G. Various designated areas of the photosensitive layer are exposed to radiation, and the portions that are exposed to radiation are then removed to yield layer 32' with a pattern of through holes 34 therein as shown in FIG. 2B, where the through holes reach all the way to die 12. Portions of the through holes 34 are filled with a material including copper, such as by placing the entire structure in a copper bath. An electric current is passed there through to perform electroplating of the copper material to fill at least a portion of each hole 34 as shown in FIG. 2C. As shown in FIG. 2C, copper material 16a fills a portion of each of holes 34. The entire structure is then transferred to a bath of material containing solder and electroplating is again employed to fill portions of holes 34, resulting in the structure shown in FIG. 2D, where a solder material 16b' fills portions of the holes 34. The photosensitive remaining layer 32' is then removed to form the structure of FIG. 2E. As shown in FIG. 2E, two elongated pillars 16' are then formed, each comprising a copper portion 16a and a solder portion 16b'. To connect the pillars to the substrate, portions 16b' are placed in contact with the copper contacts 22 on the substrate 14 as shown in FIG. 2F. The portions 16b' containing solder are then heated in a manner known to those skilled in the art to reflow the solder 16b' to form the solder portions 16b and pillars 16 as shown in FIGS. 1B and 2G. An underfill material 18 is then injected to fill the space between die 12 and substrate 14. Contacts 24 on die 12 are, therefore, physically and electrically connected and attached to contacts 22 on the substrate 14. The resulting structure is illustrated in FIG. 2G.

To provide a metal contact between the pillars and the semiconductor die, an underbump metalization layer (typically composed of a material including Titanium (Ti), titanium-tungsten (TiW), or chromuim (Cr)) function as an adhesion layer during the above-described passivation process. This layer also serves as the conducting metal contact for the copper portions of the pillars for the above-described electroplating process. After the photosensitive layer 32' has been removed, all portions of this underbump metalization layer, except for the portions underneath the pillars are removed. For simplicity, this layer has been omitted from the figures.

Since the spacing or pitch P between adjacent elongated pillars 16 as illustrated in FIGS. 1A and 2E, fine pitch of not more than 100 microns is achievable, preferably, the pitch or spacing between adjacent pillars is in the range of about 80 to about 100 microns. Since solder forms a portion of the pillar, no extra process of placing solder on the substrate is required, and the connection between the pillar and the substrate can be simply formed by reflowing the solder portion of the pillar. Furthermore, through this process, no mushroom solder bump is formed so that finer pitch can be achieved. The solder composition is flexible and can be 63/37 or 5/95 SnPb ratio, or a non-lead solder. The copper material and solder material used in the above-described electroplating processes may simply be copper metal and solder.

Figure 4A:
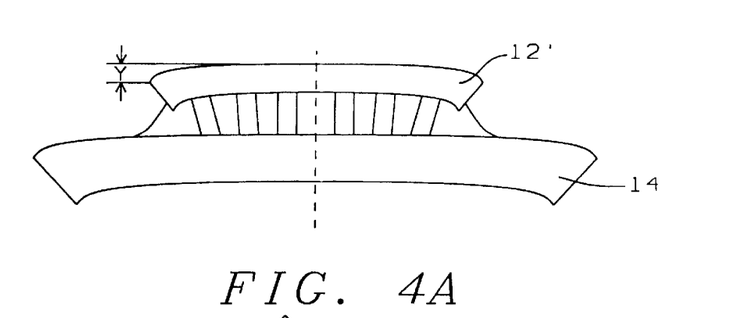
FIGS. 4A and 4B are cross-sectional views of a flip chip connected to a substrate where both the flip chip and the substrate are warped to illustrate the shear stress in the chip.
Figure 4B:
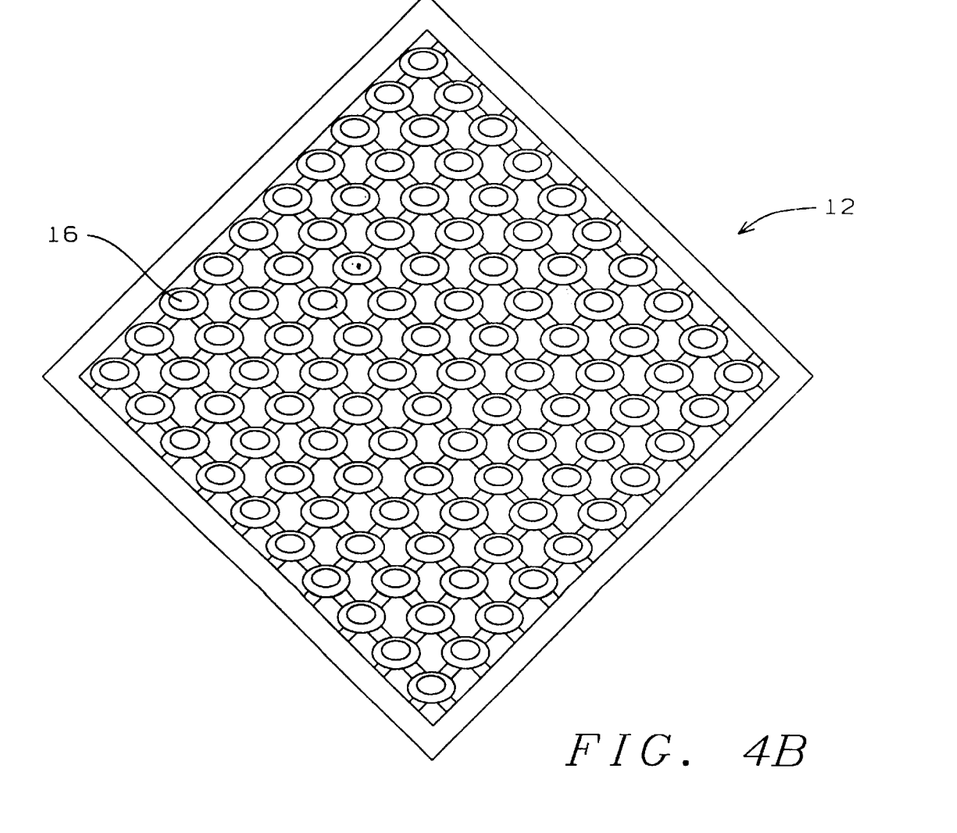
Figure 5A:
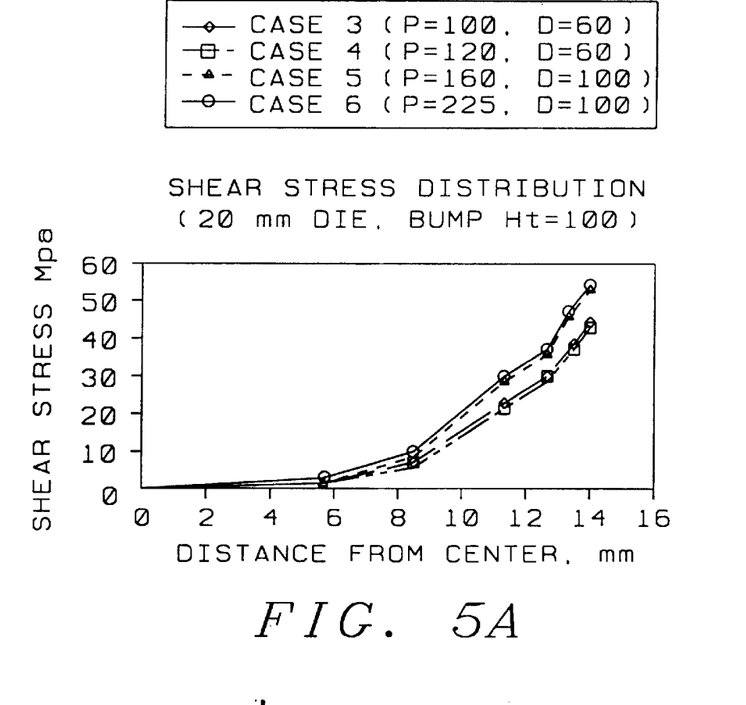
FIGS. 5A and 5B are graphical illustrations of shear stress distribution for a 20 mm die where the die is connected to a substrate using elongated pillars of this invention of 100 microns in height and bump diameter of 60 and 100 microns, and at a bump pitch of 100/120/160/225 microns to illustrate the invention.
Figure 5B:
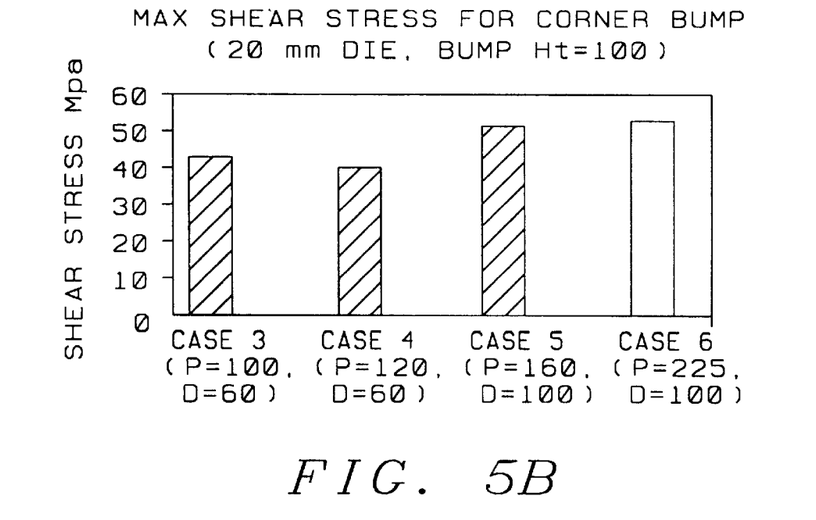
Figure 6A:
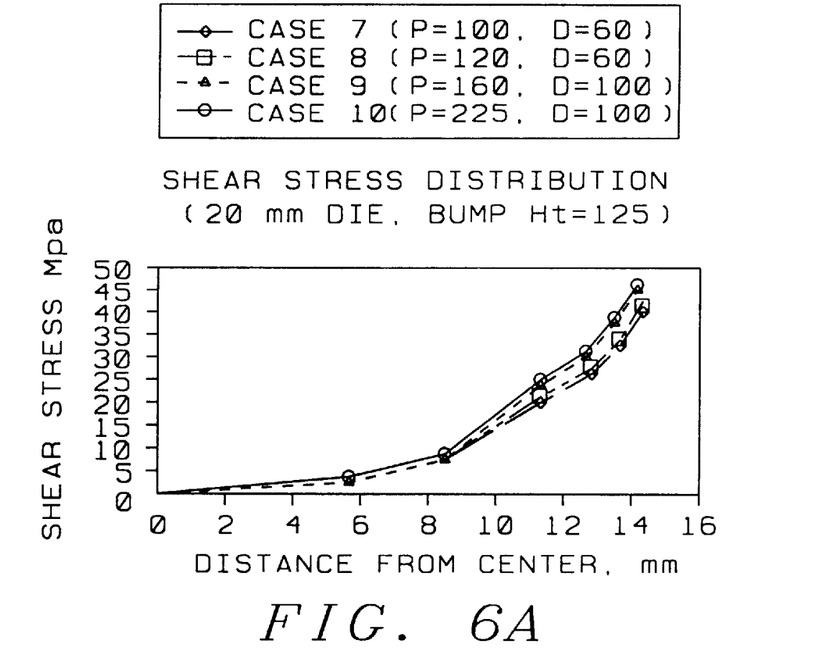
FIGS. 6A and 6B are graphical illustrations of the shear stress in the semiconductor die similar to that shown in FIGS. 5A and 5B except that the height of the elongated pillar is 125 microns instead of 100 microns.
Figure 6B:
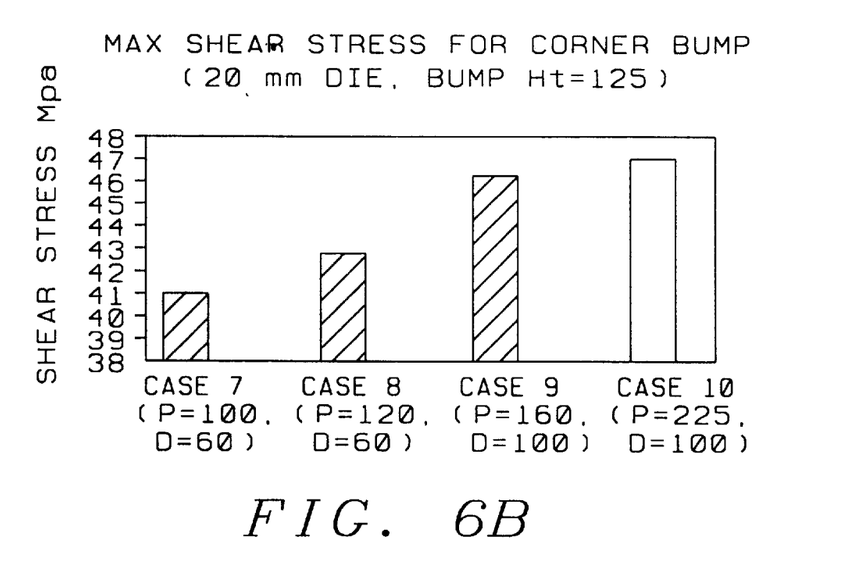

Another advantage of the elongated pillar interconnects of this invention is that it reduces shear stress experienced by warped silicon dies and the connection between the dies and the interconnects. This is illustrated in FIG. 4. As shown in FIG. 4, the silicon die 12' and substrate 14' may become warped for a number of reasons, such as due to thermal effects. Warpage is calculated as Y displacement from center to the corner of the die as shown in FIG. 4. FIGS. 5A and 5B are graphical plots illustrating shear stress distribution in a die of size 20 mm, where elongated pillars of 100 microns in length and diameters of 60 and 100 microns and at bump pitches of 100, 120, 160, 225 microns. In the graphical plot, pitch is represented as P and diameter is represented by D. As shown in FIGS. 5A and 5B, the peak shear stress at the edge of the die is less than the shear strength of copper so that the elongated pillars of this invention should not fail with the given geometry illustrated, or similar geometries, due to shear stress. FIGS. 6A and 6B illustrate similar data to those shown in FIGS. 5A and 5B but where the pillar height or length is 120 microns instead of 100 microns. A comparison of FIGS. 6A and 6B to those of FIGS. 5A and 5B will illustrate that the longer the pillars, the less will be the shear stress experienced at the edge of the die and the interconnects connected to the die.

To reduce oxidation of the copper portion 16a, a layer 50 shown in FIG. 1B of either organic or metal material may be used to cover the copper portion 16a. This will reduce reliability problems and enables the wetting (due to reduction of surface effects on the otherwise exposed copper surface) of copper sidewall by solder during the above-described reflow process for bonding the pillars to the substrate. The material used may be Entek or palladium, and may be formed by simply dipping the entire structure (i.e. die 12 and pillar 16) into a bath of such material, where the material will only adhere to the copper portion 16a. Where palladium is used, the layer 50 is formed by electrodeless plating.

While the invention has been described above by reference to various embodiments, it will be understood that changes and modifications may be made without departing from the scope of the invention, which is to be defined only by the appended claims and their equivalents.

What is claimed is:

1. A semiconductor device comprising:

a semiconductor chip, and a plurality of pillars connected to the chip, each of said pillars comprising at least two elongated portions, one portion including copper and another portion including solder, said portion including copper in contact with the semiconductor chip and having a length not less than about 50 microns.

2. The pillar of claim 1, wherein the length of the pillar is not less than about 55 microns.

3. The pillar of claim 1, wherein the length of the pillar is not less than about 100 microns.

4. The semiconductor device of claim 1, further comprising an underbump metallization layer between said semiconductor chip and said portion including copper.

5. The semiconductor device of claim 1, wherein said underbump metallization layer comprises titanium, titanium tungsten or chromium.

6. A semiconductor package, comprising:

a semiconductor chip;

one or more pillars connected to the semiconductor chip, each of said pillars comprising at least two elongated portions, one portion including copper and another portion including solder, said portion including copper in contact with the semiconductor chip and having a length not less than 50 microns; and a substrate, to which said portion including solder is attached.

7. The package of claim 6, further comprising a copper contact layer between said portion including solder and said substrate.

8. The package of claim 6, further comprising an underfill material formed between said semiconductor chip and said substrate.

9. The package of claim 6, further comprising an under-bump metallization layer between said semiconductor chip and said portion including copper.

* * * * *